United States Patent [19]
Kapitulnik

[11] Patent Number: 5,241,828
[45] Date of Patent: Sep. 7, 1993

[54] CRYOGENIC THERMOELECTRIC COOLER
[75] Inventor: Aharon Kapitulnik, Palo Alto, Calif.
[73] Assignee: Conductus, Inc., Sunnyvale, Calif.
[21] Appl. No.: 915,440
[22] Filed: Jul. 17, 1992
[51] Int. Cl.$^5$ .............................................. H01L 35/28
[52] U.S. Cl. ...................... 62/3.2; 136/238; 136/239
[58] Field of Search .............. 62/3.1, 3.2, 3.7; 136/203, 236.1, 238, 239

[56] References Cited

U.S. PATENT DOCUMENTS

| | | | |
|---|---|---|---|
| 2,811,570 | 10/1957 | Karrer | 136/238 |
| 3,027,330 | 3/1962 | Schrewelius | 136/236.1 |
| 3,239,377 | 3/1966 | Fritts et al. | 136/238 |
| 3,409,554 | 11/1968 | Mandelkorn | 252/62.3 |
| 4,500,741 | 2/1985 | Morimoto | 136/206 |
| 5,156,688 | 10/1992 | Buhler et al. | 136/211 |

OTHER PUBLICATIONS

"Sharp Metal-Insulator Transition in a Random Solid," T. F. Rosenbaum, K. Andres, G. A. Thomas, R. N. Bhatt, *Phys. Rev. Lett.*, vol. 45, No. 21, pp. 1723-1726, Nov. 24, 1980.
"Experimental Tests of Localization in Semiconductors," G. A. Thomas, *Proc. 16th Intl. Conf. on the Phys. of Semiconductors*, M. Averous, ed., pp. 81-83, 1983.
"Tunneling and Transport Measurements at the Metal-Insulator Transition of Amorphous Nb:Si," G. Hertel, D. J. Bishop, E. G. Spencer, J. M. Rowell, R. C. Dynes, *Phys. Rev. Lett.*, vol. 50, No. 10, pp. 743-746, Mar. 7, 1983.
"Metal-Insulator Transition and Superconductivity in Amorphous Molybdenum-Germanium Alloys," S. Yoshizumi, D. Mael, T. H. Geballe, R. L. Greene, from *Localization and Metal Insulator Transitions*, H. Fritzsche and D. Adler, eds., Plenum, New York, pp. 77-87, 1986.
"Thermoelectric cooling at very low temperatures," A. Kapitulnik, *Appl. Phys.*, , vol. 60, No. 2, pp. 180-182, Jan. 13, 1992.

*Primary Examiner*—Albert J. Makay
*Assistant Examiner*—William C. Doerrler
*Attorney, Agent, or Firm*—Kimberley Elcess; Neil B. Schulte; Marvin E. Jacobs

[57] ABSTRACT

A Seebeck effect thermoelectric cooler, operative at cryogenic temperatures, in which two materials having different Seebeck coefficients are in electrical contact so that current flow thereacross cools the junction. One or both of the materials comprise a metal-insulator transition material characterized by doping, alloying, or other means to be just slightly metallic so that electrical resistance becomes lower at lower temperatures, but the Seebeck coefficient does not decline at lower temperatures, as would be the case if the material were allowed to become fully metal-like.

35 Claims, 1 Drawing Sheet

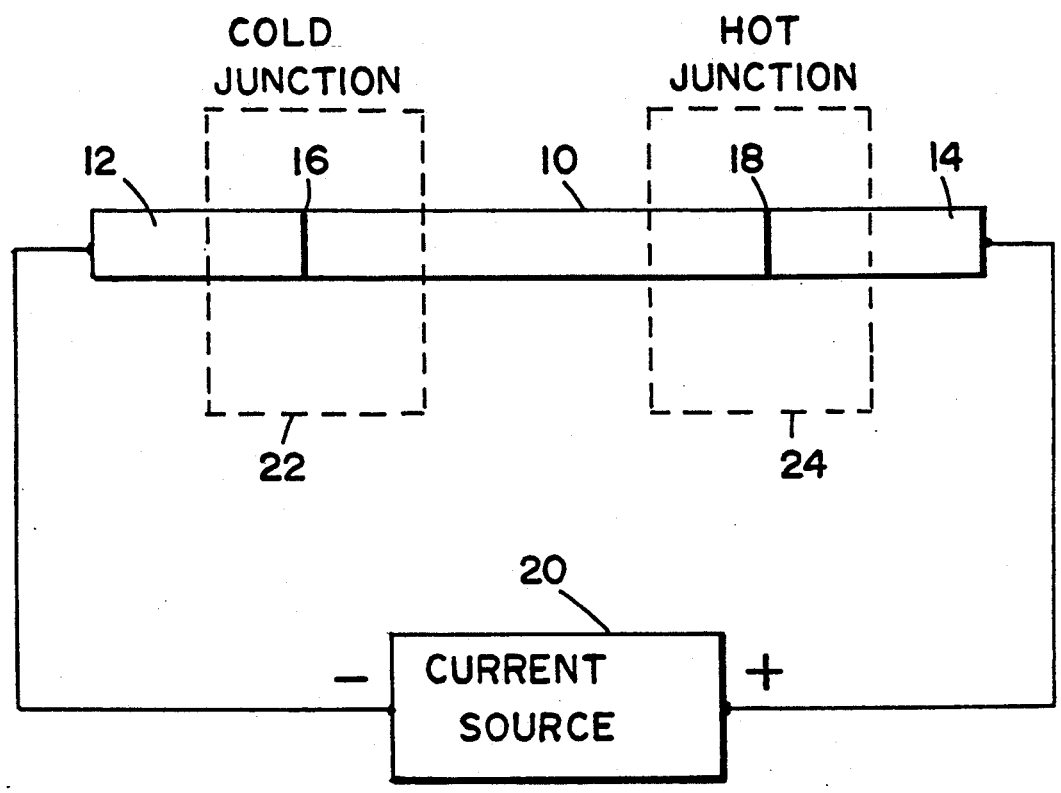

CRYOGENIC THERMOELECTRIC COOLER

TECHNICAL FIELD

This invention concerns thermoelectric effect coolers that generate low temperatures by means of the Peltier effect. More particularly, special materials are disclosed that allow the Peltier effect to be utilized at extremely low temperatures.

BACKGROUND OF THE INVENTION

When any two dissimilar materials are in contact, and an electric current flows from one material to the other, heat energy flows into or out of the junction between the materials. Whether the heat flows in or out depends on the direction of the current flow. This is the well-known Peltier effect. The amount of heat flow is proportional to the amount of current and is also proportional to the Peltier coefficients of the two materials. The Peltier coefficient is an empirically measured number that must be established for any material. Compact cooling devices have been constructed from such junctions to, for example, remove heat from electronic circuits. Typically, prior art cooling devices comprise a pair of junctions. If two such junctions are connected in series, but with opposite polarity, so that one common material serves as one side of both junctions, heat is absorbed by one junction and transferred through the common material to be discharged by the other junction. Hence, an effective heat pumping mechanism may be built to move heat energy between any two desired locations. The converse effect is also observed. If the two junctions are held at different temperatures, a voltage is produced across the series connected junctions. This is known as the Seebeck effect. The generated voltage is the Seebeck voltage. When the two materials forming the junctions cooperate to yield a large Peltier coefficient, a comparatively large Seebeck voltage is developed. The Seebeck coefficient of each material is equal to the Peltier coefficient multiplied by the absolute temperature. For simple metals, the Seebeck coefficient gets smaller at lower temperatures and approaches zero as the temperature approaches zero. The common material that forms one side of both junctions needs to have the right quantum mechanical characteristics to produce a large Seebeck coefficient. In addition, the material must conduct both the electric current and the e heat current. At the same time, the common material must have a low thermal conductivity so as to prevent thermal equilibrium between the hot junction and the cold. Still further, the common material must have a low electrical resistance to prevent ordinary joule heating, from the passage therethrough of the electric current, which heat could flow to the cold junction at a greater rate than the heat is removed from the junction by the Peltier effect. Clearly, the choice of materials is severely limited. The balancing of all the above thermal and electric factors is what defines an efficient thermoelectric cooler. Prior art thermoelectric coolers use doped narrow gap semiconductors for the common material and metals for the other side of the junctions. Because of the relative Fermi levels, only the most energetic electrons can cross the junction from the metal into the semiconductor. Hence, hot electrons are selectively withdrawn from the junction, cooling it. The hot electrons flow through the common semiconductor to and across the other junction, arriving in the metal with an energy considerably in excess of the Fermi energy. The excess energy is dissipated in collisions with the lattice in the metal, warming the second junction. Metal/narrow gap semiconductor junctions are preferred in the prior art, since for a certain temperature range they combine the best balance of strong Seebeck effect, not very high resistance, and low thermal conductivity, but such junctions do not perform well at very low temperatures. This results from the fact that semiconductor resistance rises exponentially with decreasing temperature so that joule heating becomes the dominant factor. Thus, despite the improvement in the Seebeck effect at lower temperatures, the prior art cooling devices are overwhelmed by resistive heating from the electric current. The present invention avoids this problem with new and novel junction materials that allow efficient operation at cryogenic temperatures.

SUMMARY OF THE INVENTION

Briefly, the present invention contemplates using a common junction material that is modified by doping, alloying, or other techniques to be neither a metal nor an insulator, but rather to be just at the transition in behavior between metal behavior and insulator behavior. Metal behavior includes being electrically conductive. Insulators are, of course, not electrically conductive. For the purposes of this application, the terms "semiconductor" and "insulator" are synonymous. At the very low temperatures to which this invention is directed, all the available charge carriers in semiconductors are essentially frozen out. Electrical resistance becomes very large, and thus, semiconductors become insulators. More specifically, the common junction material is designed to be slightly metallic. The term "slightly metallic" is defined, for the purposes of this specification, to have a certain meaning that is characterized by its thermoelectric behavior. As is shown hereinafter, no one material composition is slightly metallic under all circumstances. The thermoelectric behavior varies depending on the temperature of operation, the presence of magnetic fields, the incidence of light or other radiation on the junction, the current and voltage applied to the junction, and the physical geometry of the common junction material. Therefore, the actual composition of a junction material will vary in accordance with the above factors in order to be slightly metallic. However, the term "slightly metallic" can be clearly defined with respect to its thermoelectric behavior, as described below. For example, if silicon is slightly doped with phosphorus, it stays a semiconductor at ordinary temperatures, but is an insulator at cryogenic temperatures. If the concentration of phosphorus is increased, eventually the composition will transform from the insulator behavior to metal behavior at a concentration of around $10^{18}$ charge carriers per cubic centimeter. Normally a metal would not be a good material to use for a thermoelectric cooler because the Seebeck coefficient is too low in metals to provide a practical device. However, as the material transforms from an insulator to a metal, there is a very narrow region, the slightly metallic region, where the electrical resistivity begins to behave as in a metal. That is to say, resistance becomes stable, or even becomes less, as the temperature is lowered. The Seebeck coefficient, however, remains high as in the semiconductor phase. Thus, if one carefully engineers the common junction material to be a slightly metallic metal-to-insulator transition material, for the expected operational geometry, temperature, and environmental factors, a thermoelectric cooler can be manufactured that is operative at arbitrarily low temperatures. Since electrical resistance is less with lower temperatures, the resistance induced joule heating does not grow to overwhelm the Peltier effect as in the prior art semiconductor thermoelectric coolers. Additional phosphorus doping moves the transition material beyond the slightly metallic region, completing the transition to the metallic behavior and causing a dramatic reduction in the Seebeck coefficient. Thus, even though electrical resistance declines at lower temperatures, the loss of the Seebeck effect makes a practical cooler impossible. In summary then, the present invention proposes a Seebeck effect thermoelectric cooler that is operative at cryogenic temperatures because the junction materials are metal-insulator transition compositions adjusted to be slightly metallic, for the operational regime characteristics, slightly metallic being defined as the range where electrical resistance declines with temperature but the Seebeck coefficient remains high or even increases with decreasing temperature. The slightly metallic range is easily determined for any given composition and any set of operating conditions by means of conventional measurements of the resistance and Seebeck voltage at the design temperature. Additional details and advantages are described in the following detailed description with reference to the drawing.

BRIEF DESCRIPTION OF THE DRAWING

The drawing FIGURE is a schematic diagram of a typical pair of series connected Peltier effect junctions, made from slightly metallic material in accordance with the teachings of the instant invention.

DETAILED DESCRIPTION OF THE INVENTION

The cryogenic thermoelectric cooler of the present invention is schematically diagrammed in the drawing. A slightly metallic common material 10 is formed in good electrical contact with a first lead material 12 and a second lead material 14 to establish a heat absorbing cold junction 16 and a heat discharging warm junction 18. Electrons are circulated through the series connected junctions 16 and 18 by a current source 20. Common material 10 is chosen to have a much larger Seebeck coefficient than leads 12 and 14. As a consequence, only thermally excited electrons have sufficient energy to cross cold junction 16, into common material 10, and up to the Fermi levels prevalent therein. The disproportionate loss of hot electrons from material 12 cools it. Heat is absorbed from the surrounding environment schematically delineated by dashed line 22. Virtually all the mobile electrons have sufficient energy to cross junction 18. As they do so, and enter the lower Fermi levels in material 14, their excess energy is transferred to the lattice and liberated as heat to the surrounding environment outlined schematically by dashed line 24. In practice, junction 18 and region 24 may be held at a very low temperature by, for example, immersion in liquid helium. If this is done, junction 16 is cooled even below the temperature of liquid helium. This remarkable achievement is not possible with a semiconductor common material 10, as used in the prior art. Despite the high Seebeck coefficient that semiconductors manifest at these low temperatures, the exponentially rising resistance of a semiconductor at lower temperatures generates a great deal of heat from the passage of current from source 20. This joule heating overwhelms any practical cooling effects, but using a slightly metallic material for the common material 10 provides a decreased resistance, and decreased joule heating, at lower temperatures while still preserving a large Seebeck coefficient.

SLIGHTLY METALLIC MATERIAL EXAMPLES

Semiconductors, which have high Seebeck coefficients, but which become insulators at low temperatures, may be treated with additional doping using conventional methods such as heat diffusion, chemical diffusion, and ion implanting so as to transform them from insulating behavior into slightly metallic behavior. Just at the transition, it has been discovered that the electrical resistance behavior will start to become metal-like, declining with temperature, before the material becomes metal-like with respect to the Seebeck effect. In this narrow region, the slightly metallic region, the Seebeck coefficient remains strong, but resistance no longer increases exponentially with declining temperature. Beyond this narrow region, the Seebeck coefficient adopts metal-like behavior, becomes proportional to temperature, and becomes very low at low temperatures.

Examples of appropriate doped semiconductors include the already mentioned silicon doped with phosphorus and germanium doped with antimony. A partial list of other appropriately doped semiconductors is contained in the Table 1 below.

TABLE 1

| Slightly metallic doped semiconductors. | | |
|---|---|---|
| MATERIAL | DOPANT | APPROXIMATE CONCENTRATION OF CHARGE CARRIERS |
| InSb | any | $10^{14}/cm^3$ |
| HgCdTe | any | $10^{14}/cm^3$ |
| SnTe | any | $10^{15}/cm^3$ |
| GaAs | any | $10^{16}/cm^3$ |
| Ge | Sb, P, As | $10^{17}/cm^3$ |
| CdS | In, Cl | $6 \cdot 10^{17}/cm^3$ |
| Si | Sb, P, As | $3 \cdot 10^{18}/cm^3$ |
| GaP | Zn | $10^{19}/cm^3$ |
| GaAs | Mn | $10^{19}/cm^3$ |
| $CH_x$ | any | $10^{20}/cm^3$ |
| $WSe_2$ | Ta | $7 \cdot 10^{20}/cm^3$ |

Another set of compounds that can be formulated to demonstrate a slightly metallic region of behavior includes amorphous metal-insulator mixtures such as AlGe, InGe, NbSi, MoGe, AuGe, AgGe, AuSi, and any metal with $SiO_2$ in ratios that vary from 15% to 50% metal, depending upon the thickness of the material. A particularly good example of a slightly metallic material is a light weight, amorphous, metallic glass with magnetic impurities such as manganese, amorphous silicon, and amorphous germanium with phosphorus dopant. These compounds are desirable because their amorphous structure decreases thermal conductivity and the presence of impurities with residual magnetic moments tends to increase the Seebeck coefficients. Some compounds exhibit a shift in the slightly metallic region in response to magnetic fields. With these compounds, a magnetic field can be used to fine-tune the proximity of the junction to the metal-insulator transition. Some examples of such compounds are given below in Table 2.

TABLE 2

Materials affected by magnetic fields.

| MATERIAL | TYPICAL MAGNETIC FIELD REQUIRED TO SIGNIFICANTLY SHIFT THE METAL-INSULATOR TRANSITION (tesla) |
|---|---|
| HgCdTe | 0.7 |
| MoGe | 1 |
| InSb | 3 |
| GaAs | 2.5 |
| Ge | 4 |
| PbTe | 4 |

Still other substances are affected by incident radiation such as any semiconductor (Si, Ge, GaAs, etc.) or transition metal (Pd, Pt, etc.) and many alloys such as $Cu_3Au$ and $Zn_3Cu$.

Other potential compounds that could exhibit slightly metallic behavior include many organic compounds such as the organic conductors polyacetylene or tetramethylteraselenasulvalene charge transfer salts. Also any material, organic or inorganic, which displays charge density waves or spin density waves could be used for the slightly metallic material.

ALTERNATIVE DEVICE EMBODIMENTS

Leads 12 and 14 may comprise conventional metals like copper and aluminum. They may also comprise low temperature superconductors like niobium or high temperature superconductors like the copper oxide compounds recently discovered. The superconductors have zero electrical resistance and therefore no joule heating. The Seebeck coefficient of a superconductor is also zero and can therefore be quite different from the common material 10 Seebeck coefficient. However, the important value is the difference in the Seebeck coefficient of the two contacting materials. Such coefficients can be negative numbers. Thus, it is most desirable to incorporate contacting junction materials that have opposite signs so as to maximize the absolute difference. In this case, the leads 12 and 14 may themselves also be formulated from a slightly metallic transition material so that they too do not experience rising resistance and rising joule heating at cryogenic temperatures. The physical geometry of common material 10 is also a design consideration. If common material 10 is short or of large cross section, the thermal conduction is enhanced and the reverse leakage of heat from the warm junction to the cold junction increases. Conversely, if material 10 is long and thin, thermal conduction becomes less of a factor but electrical resistance and joule heating can increase. These geometric effects can be employed to optimize for any selected slightly metallic material, depending on whether the thermal conductivity or the electrical resistance happens to be the more severe problem. The electrical behavior is also affected by temperature. Hence, formulations may vary depending on the absolute temperature within which the cooler operates. In fact, a multiple stage thermoelectric cooling system may be designed with each stage comprising a pair of junctions utilizing a slightly metallic material optimized for its range of temperature. The system would provide an overall cooling effect of any desired magnitude.

Clearly, many variations in the formulation of slightly metallic behaving materials will be needed for optimum operation at the design temperature, shape, magnetic conditions, current levels, and selection of chemical elements. All such formulations are within the spirit and scope of the invention if the simultaneous metal-like resistance behavior and semiconductor-like Seebeck effect behavior are experienced. This is the defined slightly metallic behavior explained in this application, and no other limitation should be construed except in accordance with the appended claims and their equivalents.

I claim:

1. A thermoelectric cooler, operative at cryogenic temperatures, comprising: a first junction formed from a first material in electrical contact with a second material, said first and second materials having dissimilar Seebeck coefficients, and at least said second material comprising a slightly metallic material that does not have a rising electrical resistance with lowering temperatures but does maintain a reasonable Seebeck coefficient; and a current source connected to pass current across said junction.

2. The cooler of claim 1 including a second junction, also formed from said first and second materials, and electrically connected in series with said first junction, but of opposite polarity so that the second material of said second junction is connected to the second material of said first junction.

3. The cooler of claim 1 in which said slightly metallic material is a doped semiconductor selected from the group consisting of InSb, HgCdTe, SnTe, GaAs, Ge, CdS, Si, GaP, GaAs, $CH_x$, and $WSe_2$.

4. The cooler of claim 1 in which said slightly metallic material is an amorphous metal-insulator mixture.

5. The cooler of claim 4 in which said mixture is selected from the group consisting of AlGe, InGe, NbSi, MoGe, AuGe, AgGe, and AuSi.

6. The cooler of claim 4 in which said mixture comprises any metal and $SiO_2$.

7. The cooler of claim 1 in which said slightly metallic material is a light weight, amorphous, metallic glass with magnetic impurities.

8. The cooler of claim 7 in which said slightly metallic material is a phosphorus doped metallic glass selected from the group consisting of manganese, amorphous silicon, and amorphous germanium.

9. The cooler of claim 1 in which said slightly metallic material is subjected to a magnetic field.

10. The cooler of claim 9 in which said slightly metallic material is selected from the group consisting of HgCdTe, MoGe, InSb, GaAs, Ge, and PbTe.

11. The cooler of claim 1 in which said slightly metallic material is exposed to incident radiation.

12. The cooler of claim 11 in which said slightly metallic material is selected from the group consisting of semiconductors, transition metals, and alloys.

13. The cooler of claim 1 in which said slightly metallic material is an organic compound.

14. The cooler of claim 13 in which said organic compound is either polyacetylene or tetramethylteraselenasulvalene charge transfer salts.

15. The cooler of claim 1 in which said slightly metallic material is any material that displays charge density waves.

16. The cooler of claim 1 in which said slightly metallic material is any material that displays spin density waves.

17. The cooler of claim 2 in which said slightly metallic material is a doped semiconductor selected from the group consisting of InSb, HgCdTe, SnTe, GaAs, Ge, CdS, Si, GaP, GaAs, $CH_x$, and $WSe_2$.

18. The cooler of claim 2 in which said slightly metallic material is an amorphous metal-insulator mixture.

19. The cooler of claim 18 in which said mixture is selected from the group consisting of AlGe, InGe, NbSi, MoGe, AuGe, AgGe, and AuSi.

20. The cooler of claim 18 in which said mixture comprises any metal and $SiO_2$.

21. The cooler of claim 2 in which said slightly metallic material is a light weight, amorphous, metallic glass with magnetic impurities.

22. The cooler of claim 21 in which said slightly metallic material is a phosphorus doped metallic glass selected from the group consisting of Manganese, amorphous Silicon, and amorphous Germanium.

23. The cooler of claim 2 in which said slightly metallic material is subjected to a magnetic field.

24. The cooler of claim 23 in which said slightly metallic material is selected from the group consisting of HgCdTe, MoGe, InSb, GaAs, Ge, and PbTe.

25. The cooler of claim 2 in which said slightly metallic material is exposed to incident radiation.

26. The cooler of claim 25 in which said slightly metallic material is selected from the group consisting of semiconductors, transition metals, and alloys.

27. The cooler of claim 2 in which said slightly metallic material is an organic compound.

28. The cooler of claim 27 in which said organic compound is either polyacetylene or tetramethylteraselenasulvalene charge transfer salts.

29. The cooler of claim 2 in which said slightly metallic material is any material that displays charge density waves.

30. The cooler of claim 2 in which said slightly metallic material is any material that displays spin density waves.

31. The cooler of claim 1 in which said first material is a superconductor.

32. The cooler of claim 2 in which said first material is a superconductor.

33. The cooler of claim 1 in which said first material is also formed from said slightly metallic material.

34. The cooler of claim 2 in which said first material is also formed from said slightly metallic material.

35. The cooler of claim 34 in which said slightly metallic material is a doped semiconductor selected from the group consisting of InSb, HgCdTe, SnTe, GaAs, Ge, CdS, Si, GaP, GaAs, $CH_X$, and $WSe_2$.

* * * * *